Figure 1:
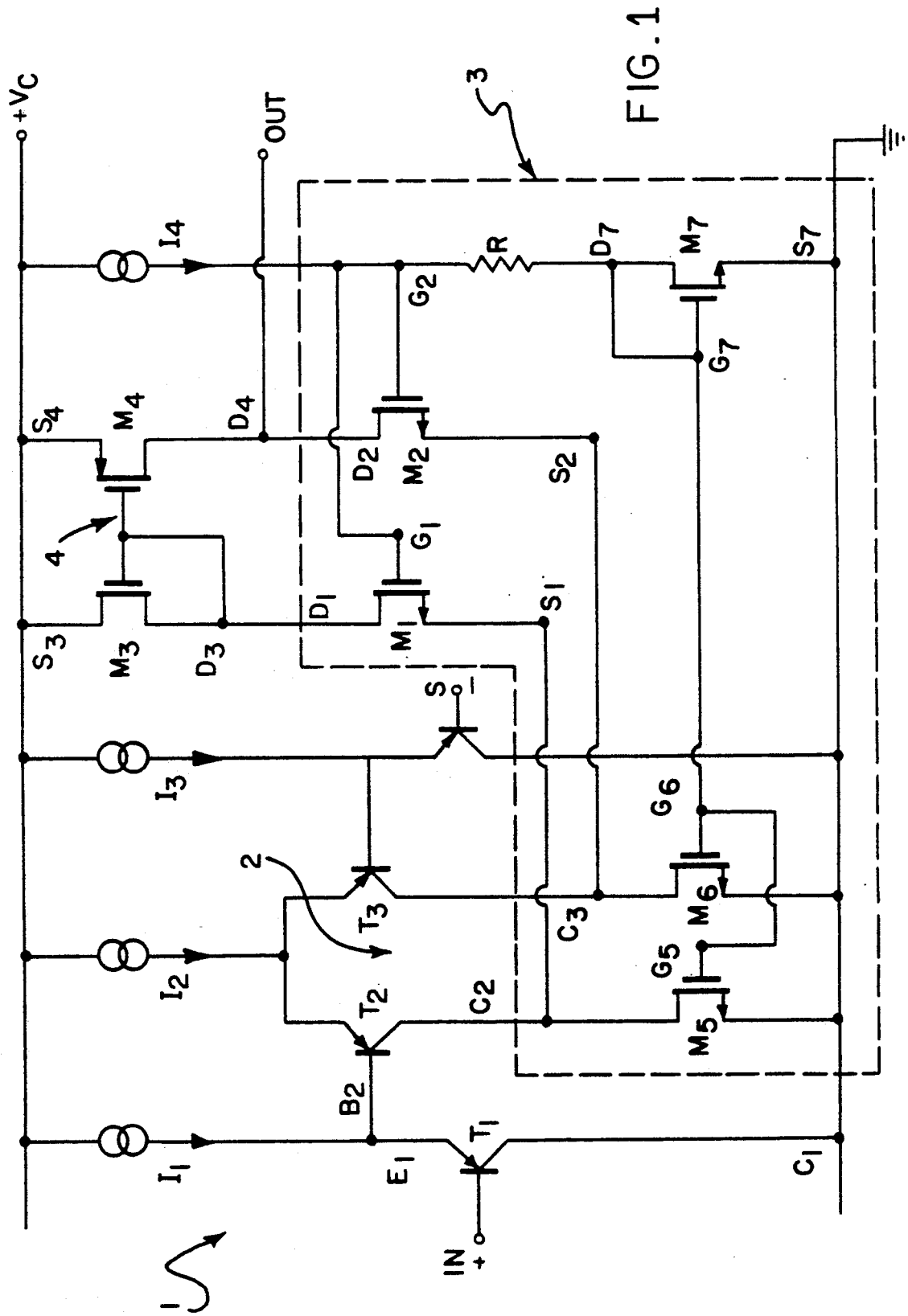

United States Patent [19]

Gola et al.

[11] Patent Number: 5,077,489
[45] Date of Patent: Dec. 31, 1991

[54] COMPARATOR CIRCUIT IMPLEMENTED IN THE BIPOLAR AND MOS TECHNOLOGY

[75] Inventors: Alberto Gola, Broni; Angelo Alzati, Bollate; Aldo Novelli, S. Lorenzo di Parabiago, all of Italy

[73] Assignee: SGS-Thomson Microelectronics S.r.l., Italy

[21] Appl. No.: 606,038

[22] Filed: Oct. 30, 1990

[30] Foreign Application Priority Data

Nov. 22, 1989 [IT] Italy .................................. 22474 A/89

[51] Int. Cl.$^5$ ............................................. H03K 5/24
[52] U.S. Cl. .................................... 307/362; 307/355; 330/257; 330/300; 330/311
[58] Field of Search ............... 307/350, 362, 363, 364, 307/355, 356, 358, 359, 570; 330/257, 300, 311

[56] References Cited

U.S. PATENT DOCUMENTS

| | | |
|---|---|---|
| 4,147,940 | 4/1979 | Beydler et al. .................. 307/475 |
| 4,342,004 | 7/1982 | Iida et al. ....................... 330/253 |
| 4,511,810 | 4/1985 | Yukawa .......................... 307/355 |
| 4,710,724 | 12/1987 | Connell et al. ................. 307/362 |
| 4,797,583 | 1/1989 | Ueno et al. .................... 307/570 |

Primary Examiner—Stanley D. Miller
Assistant Examiner—Sinh N. Tran
Attorney, Agent, or Firm—Leydig, Voit & Mayer

[57] ABSTRACT

An electronic comparator circuit having a high speed during switch phase and combining the advantages of bipolar technology with those of CMOS technology. The circuit consists of a differential stage input circuit having a differential pair of bipolar transistors forming its outputs. The output stage contains a pair of MOS transistors having gate electrodes in common. The pair of MOS transistors is connected on one side to the outputs of the input portion and on the other side to a positive supply pole via a current mirror circuit. The output contains another pair of MOS transistors with gate electrodes in common connected between the outputs of the input portion and ground. The drain electrode of the first pair of MOS transistors forms the output for the comparator.

6 Claims, 1 Drawing Sheet

COMPARATOR CIRCUIT IMPLEMENTED IN THE BIPOLAR AND MOS TECHNOLOGY

This invention relates to an electronic comparator circuit of a type which comprises a first, differential stage input circuit portion provided with a differential pair of bipolar transistors with collectors constituting respective outputs of said input portion.

As is well known, comparator devices are used extensively in a multiplicity of electronic monitoring and control circuits to set the moment that a signal, having a waveform whatever, will reach a given reference level.

A known type of comparator may comprise an operational amplifier to the non-inverting input whereof a waveform to be compared is applied, while a predetermined reference or threshold voltage value Vs is maintained on the inverting input.

Known are comparator circuits which are implemented in the bipolar technology, for example. These are distinguished by their high accuracy, they having a high voltage gain and being subject to a so-called "offset" voltage drop which is specially low.

Such circuits lend themselves to have their output interfaced with either logic circuits in the bipolar technology or logic circuits of the CMOS type.

While being beneficial under several aspects, this kind of comparator experiences considerable delay in the signal propagation between the input and the output due to the presence of so-called "saturating" circuit structures.

Most of the times, long delays in the signal propagation are unacceptable because they would add to further delays, from logic circuits downstream from the comparator and already connatural therewith.

To obviate these drawbacks, comparators could be used which incorporate so-called "non-saturating" circuit structures, which structures would employ, for example, Shottky diodes between the bases and the collectors of some transistors. Also required would be high bias currents.

However, to provide such structures, the regular production process would have to be burdened which yields bipolar technology integrated circuits by additional, complex and costly processing steps (e.g., triple metallization).

The technical problem underlying this invention is to provide an electronic comparator circuit which is specially fast in its switch phase and has such structural and functional characteristics as to be coupleable with logic circuits of the CMOS type, while ensuring low current draw and overcoming the shortcomings with which the prior art is beset.

This problem is solved by a comparator circuit as indicated, being characterized in that it incorporates an output stage comprising a first pair of MOS transistors, with gate electrodes in common, being respectively connected on the one side to said outputs and on the other side to a positive supply pole via a current mirror circuit, and a second pair of MOS transistors, with their gate electrodes in common, being connected between said outputs and ground, a drain electrode of said first pair of MOS transistors forming an output terminal for the comparator.

The features and advantages of a circuit according to the invention will become apparent from the following detailed description of an embodiment thereof, given by way of illustration and not of limitation with reference to the accompanying drawing.

The drawing shows, as FIG. 1 thereof, a wiring diagram of the electronic comparator circuit according to the invention.

With reference to the drawing, generally and schematically indicated at 1 is the circuit construction of the inventive comparator.

The comparator 1 comprises a first, differential stage circuit portion 2 consisting of a differential pair of transistors T2 and T3 of the pnp type, which have respective emitters connected together and to a positive supply pole Vc via a bias current source I2.

The respective bases B2 and B3 of said transistors T2, T3 are connected, in turn, to the positive pole Vc via respective bias current sources I1 and I3.

The collectors C2, C3 of said differential transistor pair, T2 and T3, constitute respective outputs of said input portion 2.

The stage 2 has a signal input IN and a threshold input S, each having a corresponding transistor T1, T4 of the pnp type associated therewith, with each transistor connected into an emitter-follower configuration between the stage 2 and ground.

These transistors T1, T4 form so-called buffers to increase the input impedance of the stage 2. They have their respective bases B1, B4 coincident with said inputs IN and S; the emitters E1 and E4 respectively connected to the base B2 and the base B3 of the differential pair T2, T3; and their respective collectors C1, C4 connected to ground.

Advantageously, the cell 2 of the comparator 1 has its output connected to an output stage 3 formed in the CMOS technology and comprising a pair of n-channel, MOS transistors M1 and M2 which have their respective gates G1, G2 connected together.

Said MOS transistors M1, M2 are connected, in a so-called "cascade" configuration to the bipolar stage 2, with their respective source electrodes S1, S2 connected to the collectors C2, C3, respectively, of each corresponding transistor T2, T3.

Also provided is a current mirror circuit 4 consisting of a pair of p-channel, MOS transistors M3, M4 and being connected between the supply pole Vc and said stage 3. In particular, the transistor M3 is in a diode configuration, and both transistors M3 and M4 have their respective source electrodes S3, S4 connected to the pole VC, and their respective drain electrodes D3, D4 connected to the corresponding drain electrodes D1, D2 of the first transistor pair M1, M2 in the stage 3.

The drain D2 of transistor M2 also forms an output terminal OUT for the comparator 1. A bias current source or generator I4 is further provided which is connected between the pole Vc and the gates G1 and G2 of the stage 3.

The circuit construction of the comparator 1, and of the output stage 3, is completed by a second pair of transistors M5, M6 of the MOS type, each inserted as a current source between a corresponding collector C2, C3 of the stage 2 and ground. Specifically, the transistors M5, M6 have their respective gates G5, G6 connected together; the source electrodes S5, S6 connected to ground; and the drain electrodes D5, D6 connected to the collector C2 and the collector C3, respectively.

Also provided is a further transistor M7 of the MOS type which is connected into a diode configuration with the gate G7 connected to the drain D7, between the gate G2 of transistor M2 and ground, via a resistor R.

The last-mentioned transistor M7 also has the gate G7 connected directly to the gates G5, G6 of the second pair of transistors M5, M6.

In a preferred embodiment, the value of the current source I4 is selected to correspond with a predetermined current value I. In addition, the source I2 has a value of 2I, and the current Id through each of the transistors M5 and M6 a value of 3I.

The bias current sources I1, I3 have the same value.

With reference to a starting state under stationary conditions: that is, with the respective voltage values Vin and Vs on the input terminals IN and S being equal, the current which flows through each of the transistors T2, T3 in the stage 2 will correspond with the value I. Consequently, through each of the transistors M1 and M2 in the output stage there is flown a current of 2I.

It may be shown that the cut-in point of the circuit depends solely on the value of the current I and the resistor R, additionally to the dimensional ratio W/L of the width to the length of the MOS transistor channels.

The threshold voltage of the transistors M1 and M2 of stage 3 corresponds with that of transistor M7.

On the other hand, where the voltage levels on the inputs of the differential stage 2 differ from each other, and the stage itself is completely off balance, it may be assumed that the transistor T3 is fully conducting, whereas the transistor T2 is cut off.

In this situation, the current flowing through the transistor T3 would be equal to 2I, and the highest voltage value achievable on the collector C3 would be given by the product of $R \times I$.

Therefore, by arranging for this voltage value to be equal to 0.4 Volts, for example, and selecting the values of I and R, the transistors T2 and T3 can be prevented from becoming saturated, thus making the comparator 1 uniquely fast during the switch phase.

In order to allow for variations in the base-emitter voltage drop of the transistors T2, T3 with temperature, the value of the current I may be made proportional to that voltage drop.

By an appropriate choice of the value of the current I and of the ratio W/L, the transistors in the stage 3 can be sized to have the lowest voltage between the collector C3, of the transistor T3, and ground equal to 0.

In that case, the minimum value of the voltage on the output terminal OUT would also be nil.

Where, on the contrary, the current flowing through the transistor M1 is much higher than that through the transistor M2, the voltage value at the output OUT will be practically the same as the supply voltage Vc.

It follows that the broad range of the output voltage will make the comparator 1 a suitable one to both drive bipolar circuits and circuits of the MOS type.

The comparator circuit 1 of this invention combines the advantages afforded by circuits implemented in the bipolar technology and the MOS technology.

This circuit has shown to have a good gain and a low input offset voltage drop. Furthermore, it has shown to be quite fast during the switch phase, because of the absence of bipolar transistors operated in saturation, which affords a concurrent low current draw.

We claim:

1. An electronic comparator circuit of a type which comprises a first, differential stage input circuit portion provided with a differential pair of bipolar transistors with collectors constituting respective outputs of said input portion, characterized in that it incorporates an output stage comprising a first pair of MOS transistors, with gate electrodes in common, being respectively connected on the one side to said outputs and on the other side to a positive supply pole via a current mirror circuit, and a second pair of MOS transistors, with gate electrodes in common, being connected between said outputs and ground, a drain electrode of said first pair of MOS transistors forming an output terminal for the comparator.

2. A circuit according to claim 1, characterized in that said first pair of MOS transistors are connected into a cascade configuration connected to the outputs of the bipolar transistor pair.

3. A circuit according to claim 1, characterized in that said output stage comprises a further MOS transistor connected in diode configuration between the gates of said first pair of MOS transistors and ground, via a resistor, and with the gate electrode connected directly to the gates of said second pair of MOS transistors.

4. A circuit according to claim 1, characterized in that said mirror current circuit comprises a further pair of MOS transistors, of which one is in a diode configuration, and is inserted between said positive supply pole and the drain electrodes of said first pair of MOS transistors.

5. A circuit according to claim 1, characterized in that said first input circuit portion has a signal input and a threshold input respectively associated with corresponding bipolar transistors connected into an emitter-follower configuration between ground and said differential stage.

6. A circuit according to claim 1, characterized in that it includes a bias current source between said positive supply pole and the gates of said first pair of MOS transistors.

* * * * *